(12) United States Patent
Liu et al.

(10) Patent No.: US 9,214,356 B2
(45) Date of Patent: Dec. 15, 2015

(54) MECHANISMS FOR FORMING PATTERNS

(71) Applicant: Taiwan Semiconductor Manufacturing Company, Ltd., Hsin-Chu (TW)

(72) Inventors: Ru-Gun Liu, Zhubei (TW); Chung-Te Lin, Tainan (TW); Ming-Feng Shieh, Yongkang (TW); Shih-Ming Chang, Zhubei (TW); Tsai-Sheng Gau, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/753,829

(22) Filed: Jun. 29, 2015

(65) Prior Publication Data

US 2015/0303067 A1  Oct. 22, 2015

Related U.S. Application Data

(63) Continuation of application No. 14/090,848, filed on Nov. 26, 2013, now Pat. No. 9,070,630.

(51) Int. Cl.
*H01L 21/302* (2006.01)
*H01L 21/308* (2006.01)

(52) U.S. Cl.
CPC .................. *H01L 21/3086* (2013.01)

(58) Field of Classification Search
None
See application file for complete search history.

(56) References Cited

U.S. PATENT DOCUMENTS

| 6,955,961 | B1 * | 10/2005 | Chung .......................... 438/241 |
| 8,298,943 | B1 | 10/2012 | Arnold et al. |
| 2015/0147887 | A1 | 5/2015 | Liu |

* cited by examiner

*Primary Examiner* — Kyoung Lee
(74) *Attorney, Agent, or Firm* — Haynes and Boone, LLP (57) ABSTRACT

The present disclosure provides a method for forming patterns in a semiconductor device. In accordance with some embodiments, the method includes providing a substrate and a patterning-target layer over the substrate; forming one or more mandrel patterns over the patterning-target layer; forming an opening in a resist layer by removing a first mandrel pattern and removing a portion of the resist layer that covers the first mandrel pattern; forming spacers adjacent to sidewalls of a second mandrel pattern; removing the second mandrel pattern to expose the spacers; forming a patch pattern over the spacers and aligned with the opening; etching the patterning-target layer using the patch pattern and the spacers as mask elements to form final patterns; and removing the patch pattern and the spacers to expose the final patterns.

20 Claims, 11 Drawing Sheets

MECHANISMS FOR FORMING PATTERNS

PRIORITY DATA

The present application is a continuation of U.S. application Ser. No. 14/090,848, filed Nov. 26, 2013, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
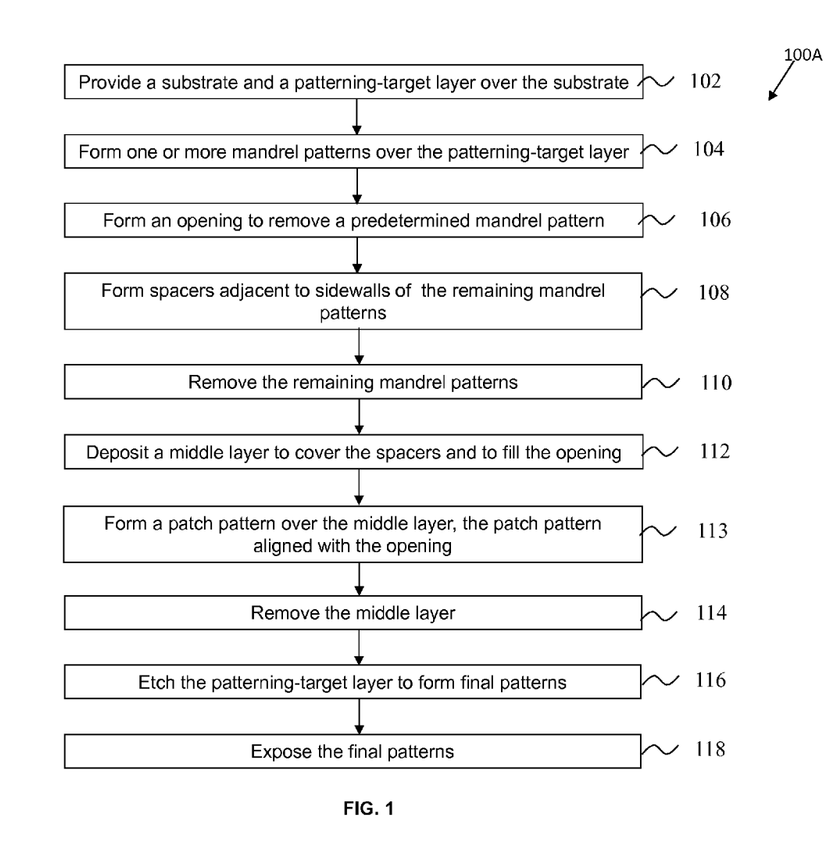
FIGS. 1, 11 and 16 are flowcharts showing methods of forming patterns of semiconductor devices according to some embodiments of the present disclosure.
Figure 2A:
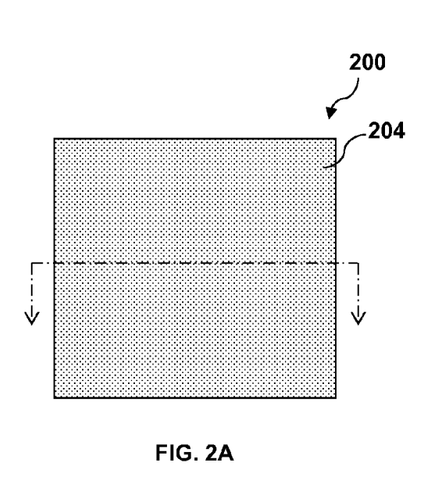
FIGS. 2A, 3A, 4A, 5A, 6A, 7A, 8A, 9A, and 10A are top views of semiconductor device 200 at various pattern formation steps constructed according to the method of FIG. 1.
Figure 2B:
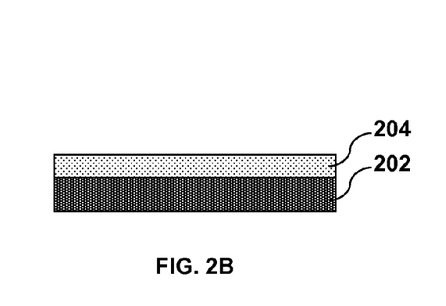
FIGS. 2B, 3B, 4B, 5B, 6B, 7B, 8B, 9B, and 10B are cross-sectional views of semiconductor device 200 along the dash lines of FIGS. 2A, 3A, 4A, 5A, 6A, 7A, 8A, 9A, and 10A respectively.

FIG. 1 shows a method 100A of forming patterns in a semiconductor device 200 (FIGS. 2A/B-10A/B) according to some embodiments of the present disclosure. Referring to FIGS. 1 and 2A-B, method 100A begins at step 102 where a substrate 202, and a patterning-target layer 204 disposed over substrate 202 are provided. Substrate 202 may be a semiconductor substrate, such as a semiconductor wafer. Substrate 202 may include silicon in a crystalline structure. In some embodiments, substrate 202 may include germanium, silicon germanium, silicon carbide, gallium arsenide, indium arsenide, indium phosphide, and/or other suitable materials. In some embodiments, substrate 202 may be a silicon-on-insulator (SOI) substrate. Substrate 202 may further include additional features and/or material layers, such as various isolation features formed in the substrate. In some embodiments, substrate 202 may include various doped regions, such as p-type doped regions and/or n-type doped regions configured and coupled to form various devices and functional features. All doping features may be achieved using a suitable process, such as ion implantation in various steps and techniques. In some embodiments, substrate 202 may include other features, such as shallow trench isolation (STI). The substrate 202 may further include various material layers, such as gate material layers.

Referring to FIGS. 2A-2B, the patterning-target layer 204 may be formed over the substrate 202. In some embodiments, the patterning-target layer 204 is the layer where the final patterns are formed over the substrate 202. In some embodiments, the patterning-target layer 204 may have a thickness in a range from about 50 Å to about 500 Å. In some embodiments, the patterning-target layer 204 may be formed using conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 204 may include dielectric materials, such as silicon oxide ($SiO_2$), silicon nitride ($Si_3N_4$), and/or silicon oxynitride (SiON). In some embodiments, the patterning-target layer 204 may include metallic materials. In some embodiments, the patterning-target layer 204 may be an upper portion of the substrate 202.

Figure 3A:
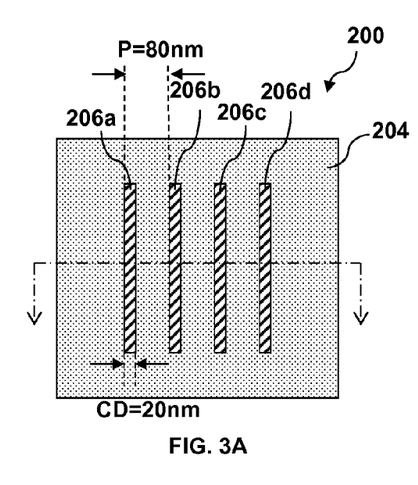
Figure 3B:
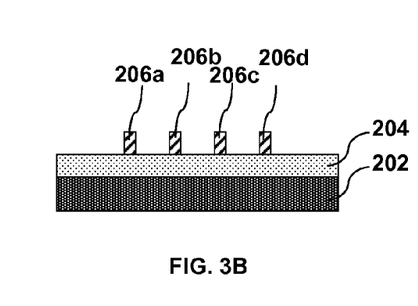

Referring to FIGS. 1 and 3A-B, method 100A proceeds to step 104 by forming one or more mandrel patterns 206a-d over the patterning-target layer 204. Mandrel patterns 206 may be sacrificial or dummy features. In some embodiments, mandrel patterns 206 may be formed in a periodical pattern over the patterning-target layer 204. For example, the periodical mandrel patterns 206 may be formed using an optical lithography process, an electron beam direct write (EBDW) technology, a nano-imprint process, or a Direct Self Assembly (DSA) process.

Referring to FIGS. 3A-3B, to form the one or more mandrel patterns 206, a mandrel layer (not shown) may be first formed over the patterning-target layer 204. In some embodiments, the mandrel layer may include materials such as silicon containing polymers. In some embodiments, the mandrel layer may be a semiconductor layer having a single crystalline or polycrystalline structure. For example, the mandrel layer may include single-crystalline silicon, polycrystalline silicon, and/or other suitable materials. The mandrel layer may be formed using any suitable deposition method, such as spin-on coating process, CVD, PVD or ALD process. In some embodiments, the mandrel layer may have a thickness in a range from about 100 Å to about 800 Å.

The mandrel layer may be then patterned to form the one or more mandrel patterns 206 using any suitable processes, such as a lithography process and an etch process. For example, a photosensitive material layer (e.g., a photoresist layer) is formed over the mandrel layer. The photoresist layer is exposed to suitable radiation (e.g. ultraviolet (UV) light) using a mask having a certain pattern (e.g., one-dimensional periodical pattern) defined for mandrel patterns 206. The patterned resist layer is developed and used as masking elements to etch the mandrel layer. The mandrel layer may be etched using any suitable etching processes such as dry etch, plasma etch, reactive ion etching, ion beam etching, and/or other suitable techniques. The one or more mandrel patterns 206 may be formed over the patterning-target layer 204. In some embodiments, the mandrel patterns may have a height in a range from about 100 Å to about 800 Å.

Referring to FIG. 3A, the one or more mandrel patterns 206 have a pitch (P). The pitch, for purposes of this disclosure, includes the width of one feature plus the width of one space to an adjacent feature. This metric may also be expressed as line/space where "line" includes the width of any feature (e.g. a line), and space includes the width of one space between adjacent two features. The pitch of mandrel patterns 206 may be defined by a lithography tool. In some embodiments, the pitch of the mandrel patterns 206 is in a range from about 10 nm to about 90 nm. In some examples, the pitch of the mandrel patterns 206 formed by an immersion lithography tool may be greater than about 70 nm. In some examples, the pitch of the mandrel patterns 206 formed by an extreme ultraviolet (EUV) lithography tool may be in a range from about 10 nm to about 30 nm. In some embodiments, the width of each mandrel pattern 206 is substantially similar to the critical dimension (CD) which is in a range from about 10 nm to about 30 nm.

Figure 4A:
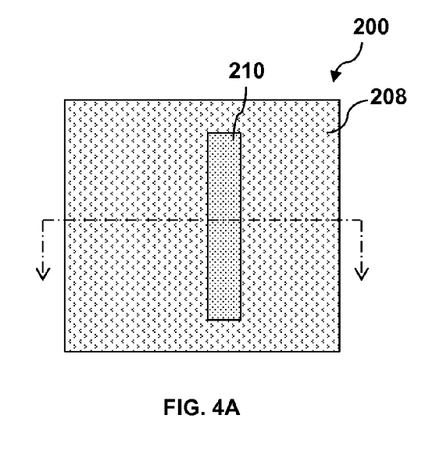
Figure 4B:
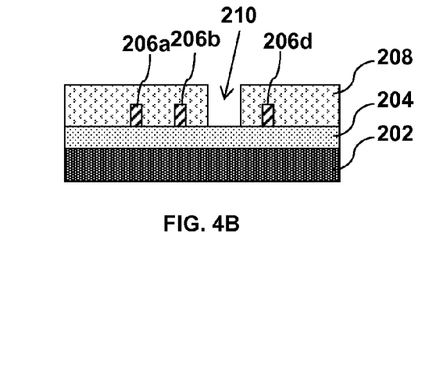

Referring to FIGS. 1 and 4A-B, method 100A proceeds to step 106 by forming an opening 210 in a resist layer 208 to remove a predetermined mandrel pattern 206c. In order to remove the predetermined mandrel pattern, the resist layer 208 may be formed on the one or more mandrel patterns 206a-d. The resist layer 208 may be formed using a spin coating method. In some embodiments, the resist layer 208 has a thickness in a range from about 600 Å to about 1200 Å. In some embodiments as shown in FIG. 4B, the thickness of the resist layer 208 is greater than the height of the mandrel patterns 206 so that the resist layer 208 covers the mandrel patterns 206. The resist layer 208 is then processed using a lithography process to form the opening 210 in the resist layer 208. For example, the resist layer 208 is exposed to UV light using a mask having a pattern of the opening 210. In some embodiments, the pattern of the opening 210 corresponds to a portion of the resist layer 208 that covers the predetermined mandrel pattern 206c. The resist layer 208 is then developed to form the opening 210 in the resist layer 208. The mandrel pattern 206c covered by the portion of the resist layer 208 corresponding to the opening 210 is also removed with the formation of the opening 210 during the developing process. In some embodiments, the opening 210 is disposed between the immediate left and right mandrel patterns 206b and 206d of the mandrel pattern 206c to be removed as shown in FIG. 4B. The resist layer 208 may then be removed to expose the mandrel patterns 206a, b, and d.

Figure 5A:
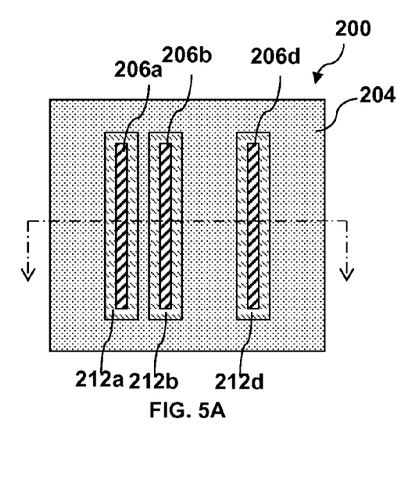
Figure 5B:
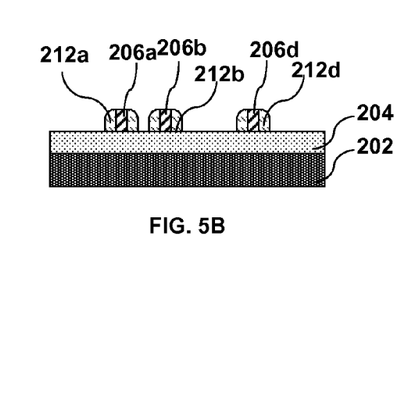

Referring to FIGS. 1 and 5A-B, method 100A proceeds to step 108 by forming spacers 212a, 212b, and 212d adjacent to the sidewalls of mandrel patterns 206a, 206b, and 206d, respectively. In some embodiments, spacers 212 are formed by depositing a spacer layer followed by an anisotropic etching process. For example, a spacer layer (not shown) may be deposited to cover the mandrel patterns 206a, 206b, and 206d. The spacer layer may include dielectric materials, such as $SiO_2$, $Si_3N_4$, and/or SiON. The spacer layer may be formed using any appropriate deposition process, such as a CVD or a PVD process. After the spacer layer is deposited, portions of the spacer layer may be removed to form the spacers. In some embodiments, this is done by performing an anisotropic etch process so that only the spacer layer materials adjacent to sidewalls of mandrel patterns 206 remain to form spacers 212a, 212b, and 212d. In some embodiments, the width of each spacer 212 is in a range from about 5 nm to about 30 nm. For example, the width of the each spacer 212 is about 20 nm. The etching process may include any suitable anisotropic etching processes, such as plasma etching, reactive ion etching (RIE), ion beam etching, and/or any other suitable etching techniques. In some embodiments, spacers 212 may be formed using an oxidation of mandrel patterns followed by an etching process. Further examples of forming spacers using an oxidation process are provided in U.S. patent application Ser. No. 13/804,679, which is hereby incorporated by reference.

Figure 6A:
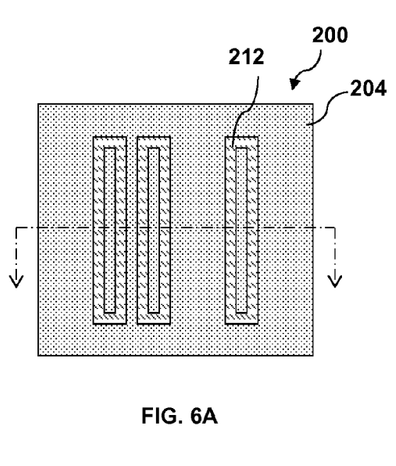
Figure 6B:
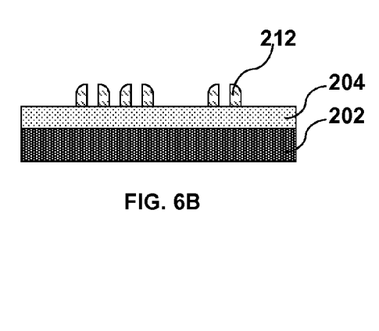

Referring to FIGS. 1 and 6A-B, method 100A proceeds to step 110 by removing the mandrel patterns 206 to expose the patterning-target layer 204. The mandrel patterns 206 may be removed by performing a wet etch, a dry etch, or a combination thereof. For example, the mandrel patterns 206 may be removed by a selective wet, a selective dry etch, or a combination thereof. The etch rate of the mandrel patterns 206 may be greater than that of the spacers and the patterning-target layer 204, so that the mandrel patterns 206 are removed while the spacers 212 and the patterning-target layer 204 remain. Exemplary selective dry etch processes include plasma etching, RIE, ion beam etching, and/or other suitable techniques, and the etchant gases may include fluorine-containing gases, such as $CF_4$, $CH_2F_2$ or $CHF_3$.

Figure 7A:
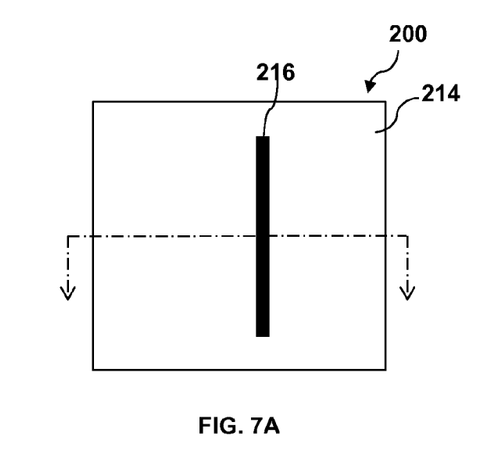
Figure 7B:
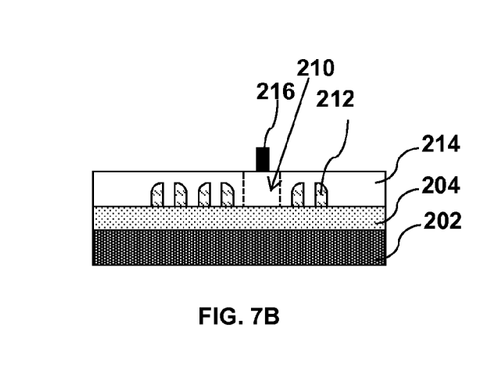

Referring to FIGS. 1 and 7A-B, method 100A proceeds to step 112 by depositing a middle layer 214 over the patterning-target layer 204 to fill the opening 210 and to cover the spacers 212. In some embodiments, the middle layer 214 may include a material containing carbon, such as silicon carbide. In some embodiments, the middle layer 214 may have a thickness in a range from about 600 Å to about 1200 Å.

Referring to FIGS. 1 and 7A-B, method 100A proceeds to step 113 by forming a patch pattern 216 over the middle layer 214. In some embodiments, the patch pattern 216 is aligned with the opening 210. The middle layer 214 may be formed using any suitable deposition method, such as CVD, PVD or ALD process.

After the middle layer 214 is formed on the spacers 212 at step 112, in order to form the patch pattern 216, a patch layer (not shown) may be first formed over the middle layer 214. In some embodiments, the patch layer may have a thickness in a range from about 50 Å to about 500 Å. In some embodiments, the patch layer may include materials such as $SiO_2$, $Si_3N_4$, and/or SiON. The patch layer may be formed using any suitable deposition method, such as CVD, PVD or ALD process. The patch layer is then processed using a lithography process to form the patch pattern 216 over the middle layer 214. For example, the patch layer is exposed to UV light using a mask having a pattern of the patch pattern 216. The patch layer is then developed so that the patch pattern 216 remains while other portions of the patch layer are removed. In some embodiments, the patch pattern 216 has a height in a range from about 50 Å to about 500 Å. In some embodiments, the patch pattern 216 may be aligned with the opening 210 as shown in FIGS. 4B and 7B. In some embodiments, the patch pattern 216 may be formed at any desirable location with any suitable width on the middle layer 214. In some embodiments, the patch pattern 216 is located at a distance in a range from about (n+0.3) times of a pitch to about (n+0.8) times of the pitch away from an adjacent spacer 212 in a direction along the layer plane, where n is an integer number. In some embodiments, the patch pattern 216 is formed to be located at a distance in a range from about 1.3 times of the pitch to about 1.8 times of the pitch away from an adjacent spacer 212 in the direction along the layer plane.

Figure 8A:
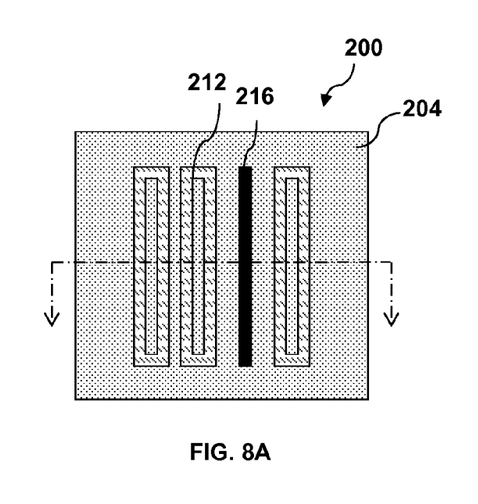
Figure 8B:
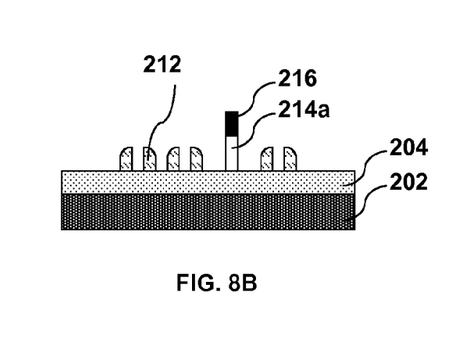

Referring to FIGS. 1 and 8A-8B, method 100A proceeds to step 114 by removing the middle layer 214. Middle layer 214 may be removed to expose the spacers 212. In some embodiments, a portion (214a) covered by patch pattern 216 remains while other portions of middle layer 214 are removed, as shown in FIG. 8B. In some embodiments, middle layer 214 may be removed using any suitable etching process, such as a selective wet etch, a selective dry etch, or a combination thereof. The etch rate of the middle layer 214 may be greater than that of the spacers 212 and the patterning-target layer 204, so that the middle layer 214 is removed while the spacers 212 and the patterning-target layer 204 remain. Exemplary selective dry etch processes include plasma etching, RIE, ion beam etching, and/or other suitable techniques, and the etchant gases may include fluorine-containing gases, such as $CF_4$, $CH_2F_2$ or $CHF_3$. In some embodiments as shown in FIG. 8B, by forming the patch pattern 216, an odd number of feature(s) may be added to spacers 212 over the patterning-target layer 204.

Figure 9A:
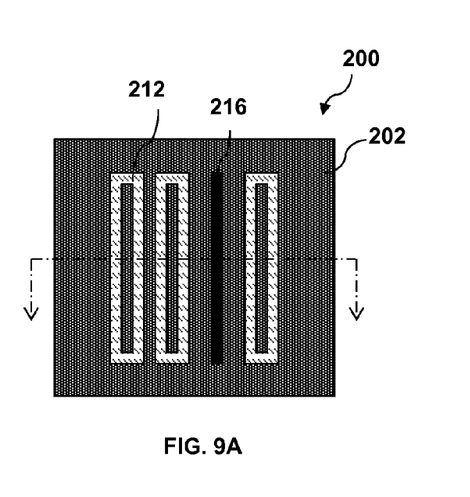
Figure 9B:
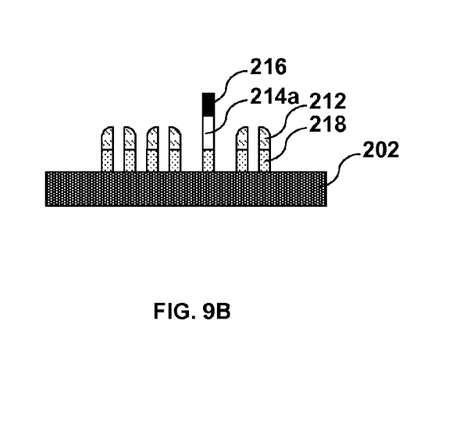

Referring to FIGS. 1 and 9A-B, method 100A proceeds to step 116 by etching the patterning-target layer 204 to form the final patterns 218. Spacers 212 and the patch pattern 216 may be used as mask elements to etch the patterning-target layer 204 to form the final patterns 218. In some embodiments, the patterning-target layer 204 may be etched using any suitable etching process, such as a wet etch, a dry etch or a combination thereof. In some embodiments, the patterning-target layer 204 may be etched using any suitable anisotropic etching processes, such as plasma etching, reactive ion etching, ion beam etching, and/or other suitable techniques.

Figure 10A:
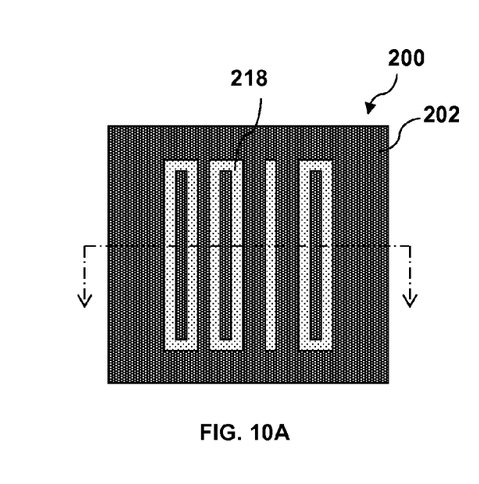
Figure 10B:
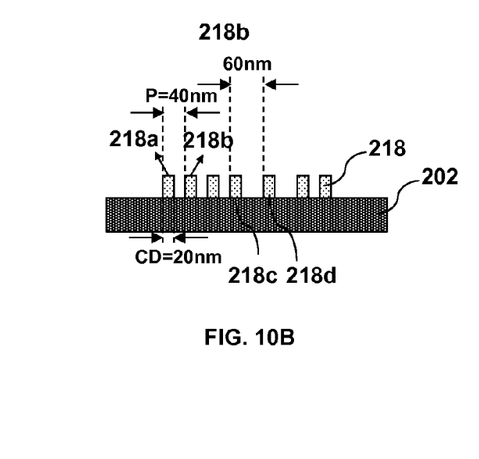

Referring to FIGS. 1 and 10A-B, method 100A proceeds to step 118 by removing the spacers 212, the patch pattern 216, and the portion of the middle layer 214a to expose the final patterns 218 on the substrate 202. In some embodiments, the spacers 212, the patch pattern 216, and the portion of the middle layer 214a may be removed using any appropriate etching process, such as a selective wet etch, a selective dry etch, and a combination thereof. In some embodiments, the etch rate of the spacers 212, the patch pattern 216, and the portion of the middle layer 214a may be greater than that of the patterning-target layer 204, so that the spacers 212, the patch pattern 216, and the portion of the middle layer 214a are etched off while the final patterns 218 remain. In some embodiments as shown in FIG. 10B, an odd number of features may be formed using the patch pattern 216 and the spacers 212 as mask elements over the substrate 202. Therefore the present disclosure provides a flexibility of forming different numbers, including even number or odd number, of features in a semiconductor device.

As discussed in one or more embodiments of the present disclosure, by forming a patch pattern aligned with the opening, the problems brought by the limited overlay error budget can be avoided by providing a greater and more controllable overlay error budget. For example, when the CD is about 20 nm, and the pitch between two adjacent mandrel patterns is about 80 nm, an overlay error budget may be less than about 10 nm. In some embodiments of the present disclosure, a greater overlay error budget may be provided to be less than about 30 nm.

In addition, in the present embodiments as discussed above, the patch pattern can be formed at a more flexible location, such as a conflict position and/or a forbidden position corresponding to a location that is not an integer times of the pitch (P) value. Therefore, the final patterns can be formed at a more flexible location. In some embodiments, the final patterns may be formed at any desirable location with any suitable width. In some embodiments, the final pattern 218c is located at a distance in a range from about (n+0.3) times of a pitch to about (n+0.8) times of the pitch away from an adjacent final pattern 218d, where n is an integer number. In some embodiments, the final pattern 218c is formed to be located at a distance in a range from about 1.3 times of the pitch to about 1.8 times of the pitch away from an adjacent final pattern 218d. For example, a final pattern can be formed at a location that is an integer times of the pitch plus about a half pitch, such as about 1.5 P, from the adjacent feature. For example as shown in FIG. 10B, when the CD is about 20 nm, and a pitch value between two adjacent features (e.g., two adjacent spacers 212, or two adjacent final patterns 218a and 218b) is about 40 nm, a feature that is about 60 nm away from a neighboring feature (e.g., the distance between two final patterns 218c and 218d) can be formed in the present embodiments.

Figure 11:
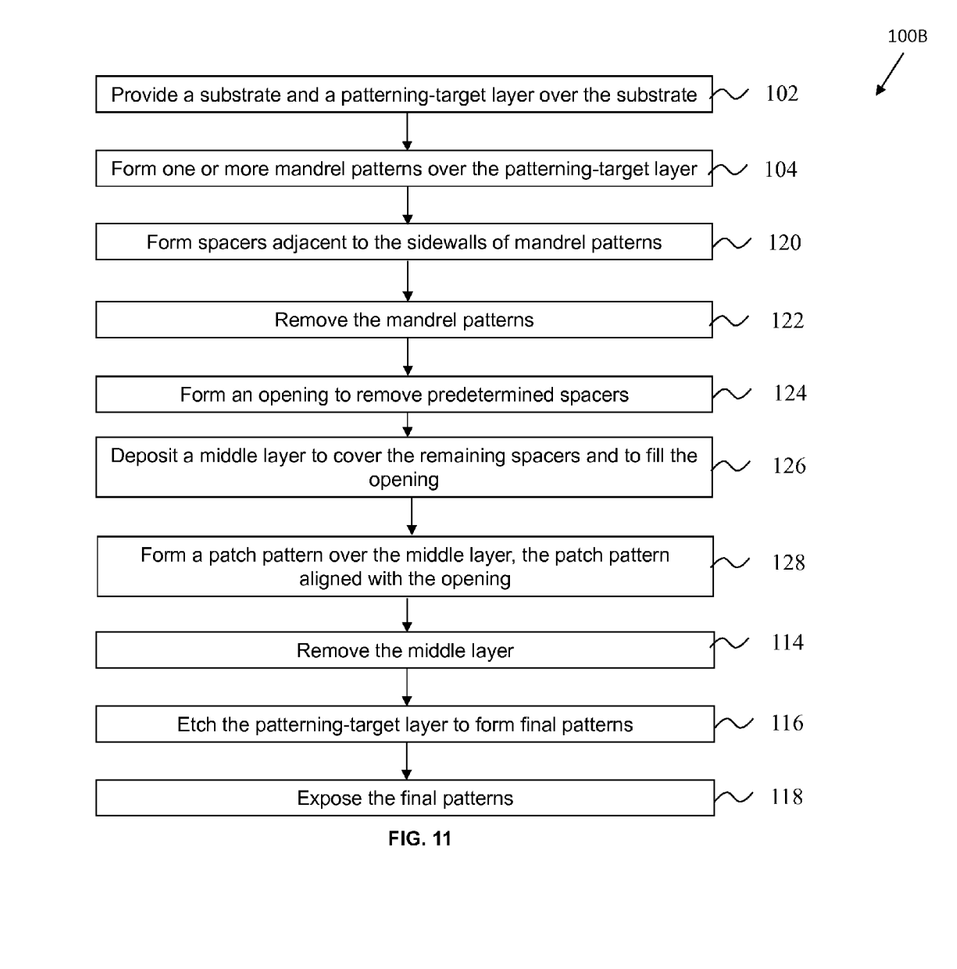

Referring to FIG. 11, a method 100B of forming patterns in a semiconductor device 300 according to some embodiments of the present disclosure is illustrated. Method 100B starts with step 102 by providing a substrate 202 and a patterning-target layer 204 disposed over the substrate 202. Method 100B proceeds to step 104 by forming one or more mandrel patterns 206a-d over the patterning-target layer 204. In some embodiments, steps 102 and 104 of method 100B are substantially similar to steps 102 and 104 of method 100A (FIGS. 2A-2B, and 3A-3B).

Figure 12A:
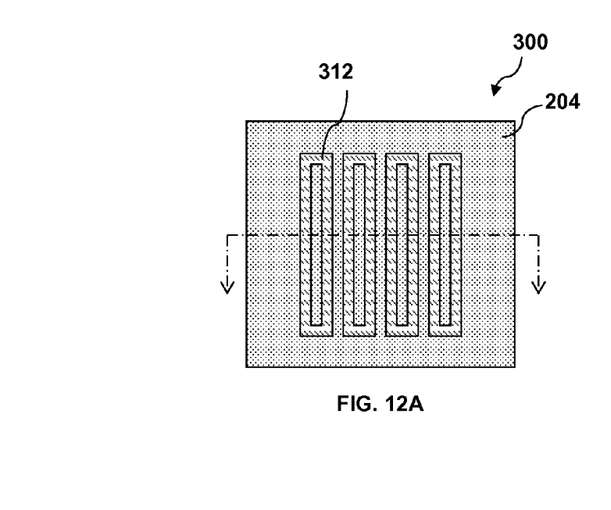
FIGS. 12A, 13A, 14A, and 15A are top views of semiconductor device 300 at various pattern formation steps constructed according to the method of FIG. 11.
Figure 12B:
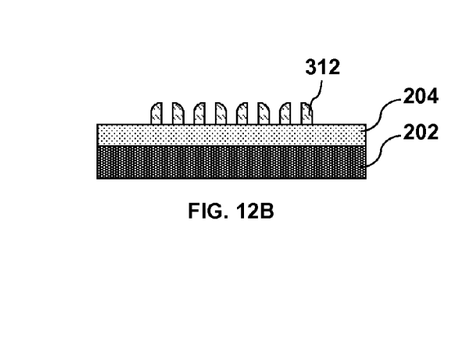
FIGS. 12B, 13B, 14B, and 15B are cross-sectional views of semiconductor device 300 along the dash lines of FIGS. 12A, 13A, 14A, and 15A respectively.

Referring to FIGS. 11 and 12A-B, method 100B proceeds to step 120 for forming spacers 312 adjacent to the sidewalls of mandrel patterns. The formation process and materials used to form spacers 312 may be substantially similar to the formation process and materials to form spacers 212 as discussed in FIGS. 5A-5B and step 108 of method 100A.

Still referring to FIGS. 11 and 12A-B, method 100B proceeds to step 122 by removing mandrel patterns to expose spacers 312 over the patterning-target layer 204. The method to remove mandrel patterns is substantially similar to the method to remove mandrel patterns 206 as discussed in FIGS. 6A-B and step 110 of method 100A.

Figure 13A:
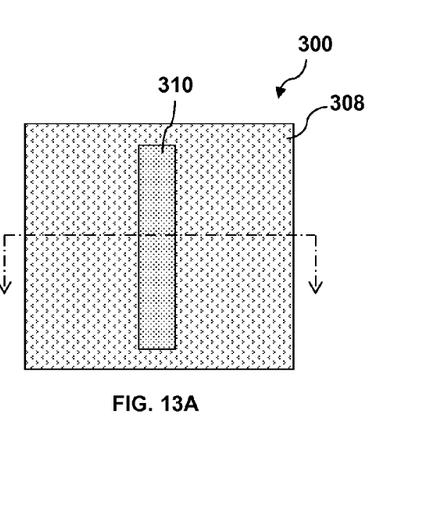
Figure 13B:
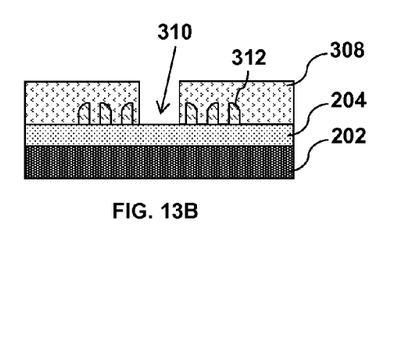

Referring to FIGS. 11 and 13A-B, method 100B proceeds to step 124 by forming an opening 310 in a resist layer 308 to remove one or more predetermined spacers. In order to remove the predetermined spacers, the resist layer 308 may be formed to cover the spacers 312. In some embodiments, the materials, thickness, and forming process of the resist layer 308 may be substantially similar to that of the resist layer 208 as discussed with respect to step 106 of method 100A. In some embodiments, the opening 310 corresponds to a portion of the resist layer 308 that covers the predetermined one or more spacers 312 to be removed as shown in FIG. 12B. The resist layer 308 may be formed and patterned using substantially similar processes to form and pattern resist layer 208 as discussed with respect to FIGS. 4A-B and step 106 of method 100A. Resist layer 308 may be then removed to expose the remaining spacers 312.

Figure 14A:
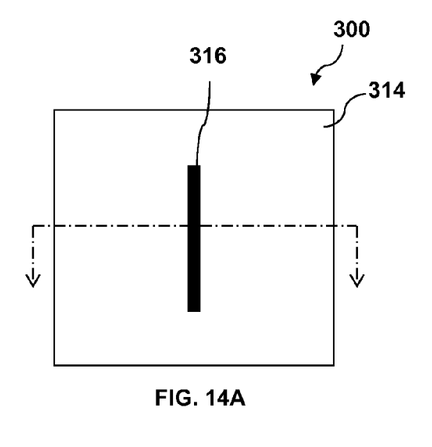
Figure 14B:
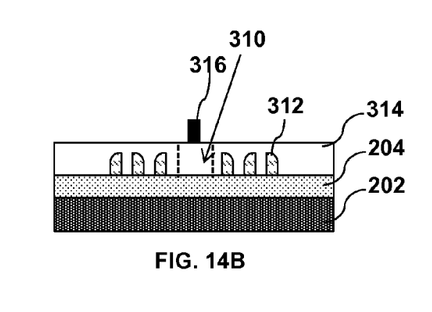

Referring to FIGS. 11 and 14A-B, method 100B proceeds to step 126 by depositing a middle layer 314 over the patterning-target layer 204 to fill the opening 310 and to cover the remaining spacers 312. In some embodiments, the formation method and the materials and thickness of the middle layer 314 are substantially similar to that of the middle layer 214 formed at step 112 of method 100A.

Referring to FIGS. 11 and 14A-B, method 100B proceeds to step 128 by forming a patch pattern 316 over the middle layer 314. In some embodiments, the formation method and the materials and height of the patch pattern 316 are substantially similar to that of the patch pattern 216 formed at 113 of method 100A. In some embodiments, the patch pattern 316 may be aligned with the opening 310 as shown in FIG. 14B. In some embodiments, patch pattern 316 may be formed at any desirable location with any suitable width over middle layer 314.

Figure 15A:
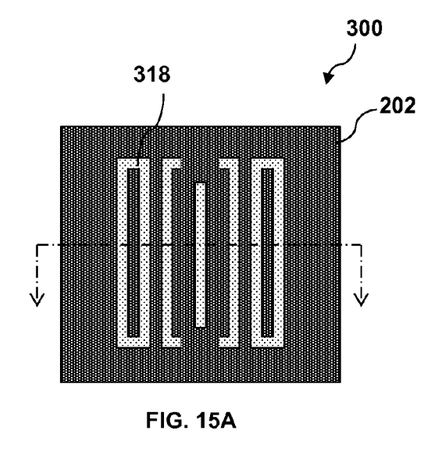
Figure 15B:
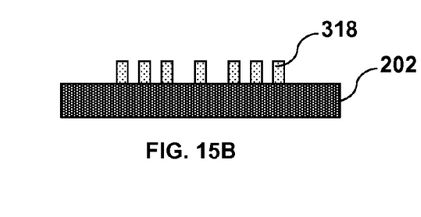

Referring to FIGS. 11 and 15A-B, method 100B proceeds to steps 114 by removing the middle layer 314, to step 116 by etching the patterning-target layer 204 to form final patterns 318, and to step 118 by removing the patch pattern 316, the middle layer 314, and the spacers 312 to expose the final patterns 318. In some embodiments, steps 114, 116, and 118 of method 100B are substantially similar to steps 114, 116, and 118 of method 100A. In some embodiments, final patterns 318 may be formed by etching the patterning-target layer 204 using patch pattern 316 and remaining spacers 312 as the mask elements.

As discussed earlier in the present disclosure with regard to method 100A, the final patterns formed by method 100B may be formed at any desirable location with any suitable width. In some embodiments, a final pattern is located at a distance in a range from about (n+0.3) times of a pitch to about (n+0.8) times of the pitch away from an adjacent final pattern, where n is an integer number. In some embodiments, a final pattern is formed to be located at a distance in a range from about 1.3 times of the pitch to about 1.8 times of the pitch away from an adjacent final pattern.

Figure 16:
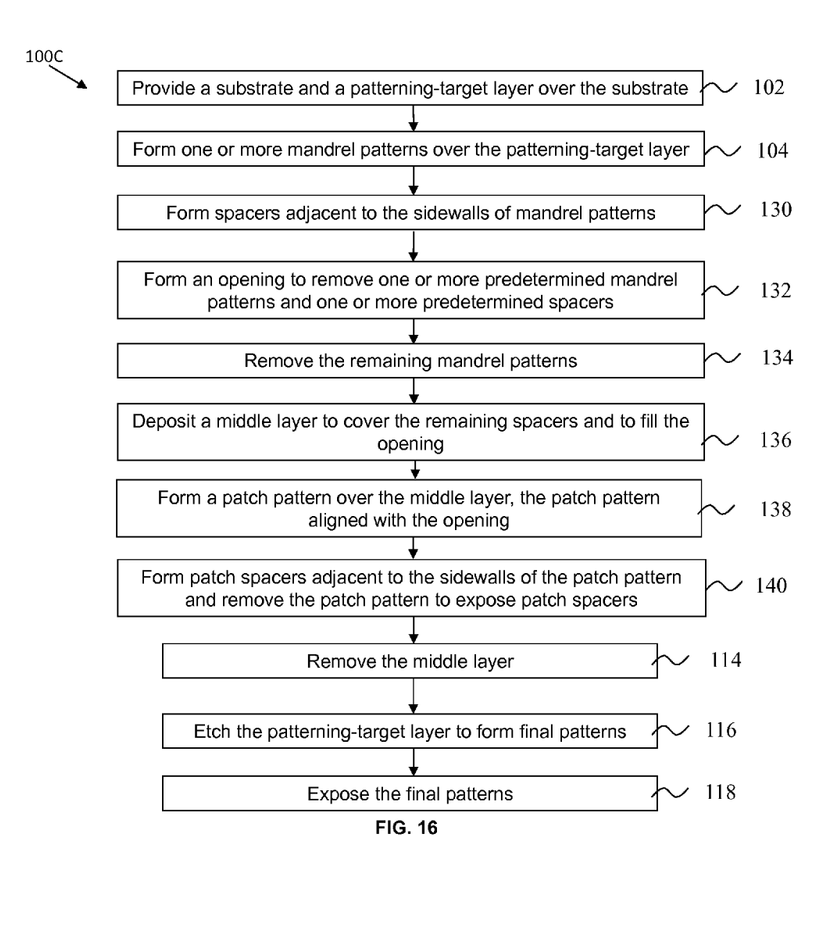

Referring to FIG. 16, yet another method 100C of forming patterns in a semiconductor device 400 according to some embodiments of the present disclosure is illustrated. Method 100C starts with step 102 by providing a substrate 202 and a patterning-target layer 204 disposed over the substrate 202. Method 100B proceeds to step 104 by forming one or more mandrel patterns 406 over the patterning-target layer 204. In some embodiments, steps 102 and 104 of method 100C are substantially similar to steps 102 and 104 of method 100A (FIGS. 2A-2B, and 3A-3B).

Figure 17A:
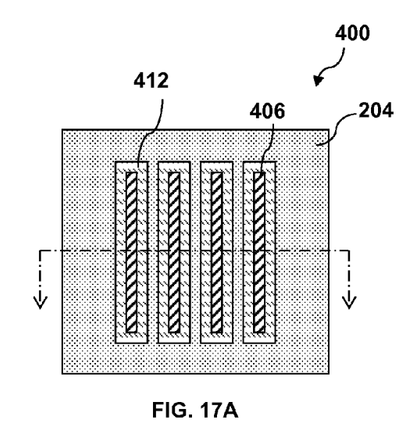
FIGS. 17A, 18A, 19A, 20A, and 21A are top views of semiconductor device 400, at various pattern formation steps constructed according to the method of FIG. 16.
Figure 17B:
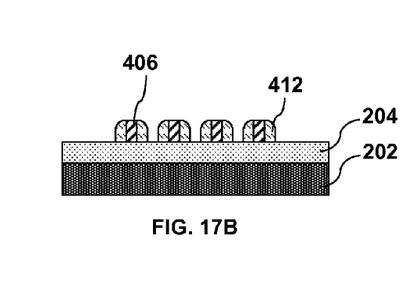
FIGS. 17B, 18B, 19B, 20B, and 21B are cross-sectional views of semiconductor device 400 along the dash lines of FIGS. 17A, 18A, 19A, 20A, and 21A respectively.

Referring to FIGS. 16 and 17A-B, method 100C proceeds to step 130 by forming spacers 412 adjacent to the sidewalls of mandrel patterns 406. The formation process and materials used to form spacers 412 may be substantially similar to the formation process and materials to form spacers 212 as discussed in FIGS. 5A-5B and step 108 of method 100A.

Figure 18A:
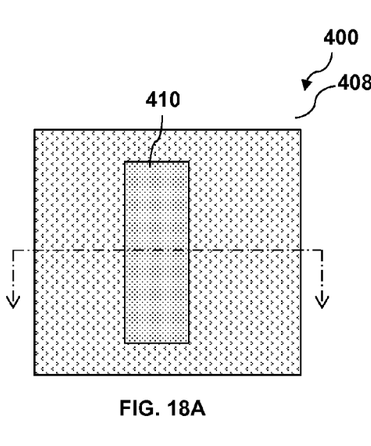
Figure 18B:
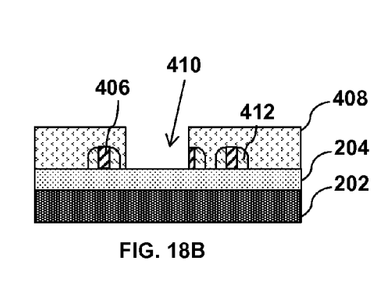

Referring to FIGS. 16 and 18A-B, method 100C proceeds to step 132 by forming an opening 410 in a resist layer 408 to remove one or more predetermined mandrel patterns 406 and one or more predetermined spacers 412. The one or more predetermined mandrel patterns may be adjacent to the one or more predetermined spacers. In order to remove the predetermined mandrel patterns and the spacers, the resist layer 408 may be formed to cover the spacers 412. In some embodiments, the materials, thickness, and forming process of the resist layer 408 may be substantially similar to that of the resist layer 208 as discussed with respect to step 106 of method 100A. In some embodiments, the opening 410 corresponds to a portion of the resist layer 408 that covers the predetermined one or more spacers 412 and the predetermined mandrel patterns 406 to be removed as shown in FIG. 18B.

Resist layer 408 may be formed and patterned using substantially similar processes to form and pattern resist layer 208 as discussed with respect to FIGS. 4A-B and step 106 of method 100A. Resist layer 408 may be then removed to expose the remaining mandrel patterns 406 and the remaining spacers 412. The resist layer 408 may be formed and patterned using substantially similar processes to form and pattern resist layer 208 as discussed with respect to FIGS. 4A-B and step 106 of method 100A.

Still Referring to FIGS. 16 and 18A-B, method 100C proceeds to step 134 by removing the remaining mandrel patterns 406 to expose the remaining spacers 412 over the patterning-target layer 204. The method to remove mandrel patterns is substantially similar to the method to remove mandrel patterns 206 as discussed in FIGS. 6A-B and step 110 of method 100A.

Figure 19A:
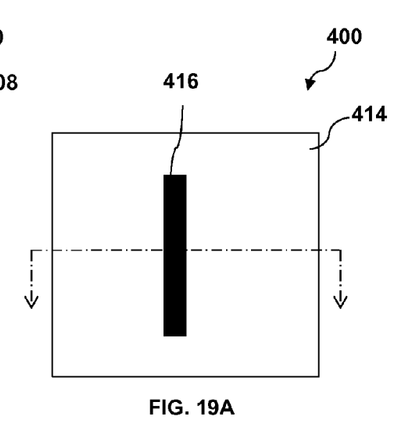
Figure 19B:
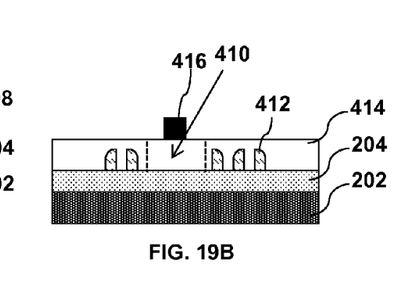

Referring to FIGS. 16 and 19A-B, method 100C proceeds to step 136 by depositing a middle layer 414 over the patterning-target layer 203 to fill the opening 410 and to cover the remaining spacers 412. In some embodiments, the formation method and the materials and thickness of the middle layer 414 are substantially similar to that of the middle layer 214 formed at step 112 of method 100A.

Referring to FIGS. 16 and 19A-B, method 100C proceeds to step 138 by forming a patch pattern 416 over the middle layer 414. In some embodiments, the formation method and the materials and height of the patch pattern 416 are substantially similar to that of the patch pattern 216 formed at 113 of method 100A. In some embodiments, the patch pattern 416 may be aligned with the opening 410 as shown in FIG. 18B. In some embodiments, patch pattern 416 may be formed at any desirable location with any suitable width over middle layer 414.

Figure 20A:
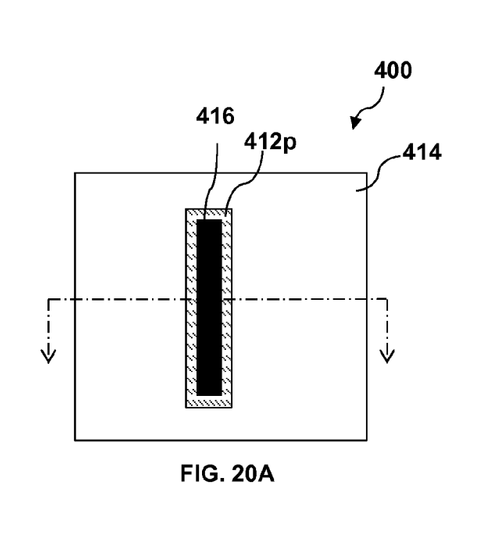
Figure 20B:
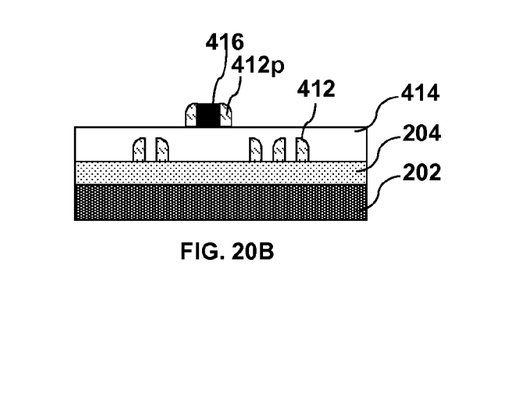

Referring to FIGS. 16 and 20A-B, method 100C proceeds to step 140 by forming patch spacers 412p adjacent to sidewalls of the patch pattern 416. The formation process and materials used to form spacers 412p may be substantially similar to the formation process and materials to form spacers 212 as discussed in FIGS. 5A-5B and step 108 of method 100A. In some embodiments, the patch pattern 416 may be removed after forming patch spacers 412p.

Figure 21A:
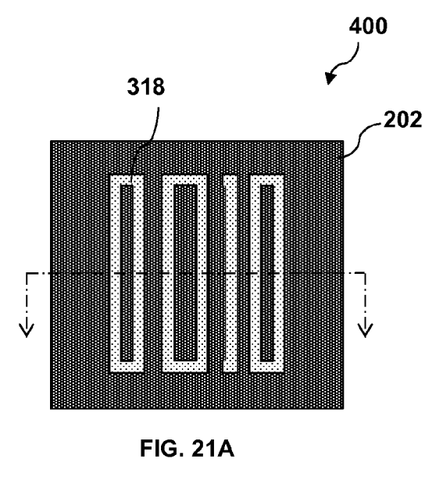
Figure 21B:
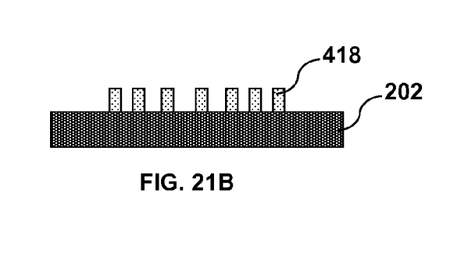

Referring to FIGS. 16 and 21A-B, method 100C proceeds to steps 114 by removing the middle layer 414, to step 116 by etching the patterning-target layer 204 to form final patterns 418, and to step 118 by removing the patch pattern 416, the middle layer 414, the patch spacers 412p, and the spacers 412 to expose the final patterns 418. In some embodiments, steps 114, 116, and 118 of method 100C are substantially similar to steps 114, 116, and 118 of method 100A as discussed in FIGS. 8-10 and method 100A. In some embodiments, final patterns 418 may be formed by etching the patterning-target layer 204 using remaining spacers 412 and spacers 412p as the mask elements.

As discussed earlier in the present disclosure with regard to method 100A, the final patterns formed by method 100C may be formed at any desirable location with any suitable width. In some embodiments, a final pattern is located at a distance in a range from about (n+0.3) times of a pitch to about (n+0.8) times of the pitch away from an adjacent final pattern, where n is an integer number. In some embodiments, a final pattern is formed to be located at a distance in a range from about 1.3 times of the pitch to about 1.8 times of the pitch away from an adjacent final pattern.

The present embodiments describe one or more manufacturable and low-cost mechanisms for forming one or more features in semiconductor devices. The mechanisms enable forming features at various locations over the substrate, including the conflict position and/or the forbidden position in other methods. The mechanisms also enable forming features in a semiconductor device with varying densities and/or varying widths. The mechanisms involve forming openings by removing one or more mandrel patterns and/or one or more spacers. The mechanisms also involve forming one or more patch patterns with varying widths at various locations over the openings, so that any number (odd number or even number) of features with varying size are formed at various locations in the present embodiments.

The present disclosure provides a method for forming patterns in a semiconductor device. In accordance with some embodiments, the method includes providing a substrate and a patterning-target layer over the substrate; forming one or more mandrel patterns over the patterning-target layer; forming an opening in a resist layer by removing a first mandrel pattern and removing a portion of the resist layer that covers the first mandrel pattern; forming spacers adjacent to sidewalls of a second mandrel pattern; removing the second mandrel pattern to expose the spacers; forming a patch pattern over the spacers and aligned with the opening; etching the patterning-target layer using the patch pattern and the spacers as mask elements to form final patterns; and removing the patch pattern and the spacers to expose the final patterns. In some embodiments, a first final pattern is located at a distance in a range from about (n+0.3) times of a pitch to about (n+0.8) times of the pitch away from an adjacent second final pattern, where n is an integer number. The pitch is a distance between two adjacent spacers plus a width of a spacer.

The present disclosure provides yet another embodiment of a method for forming patterns in a semiconductor device. In accordance with some embodiments, the method includes providing a substrate and a patterning-target layer over the substrate; forming one or more mandrel patterns over the patterning-target layer; forming spacers adjacent to sidewalls of the mandrel patterns; removing the mandrel patterns to expose the spacers; forming an opening in a resist layer by removing a first spacer and removing a portion of the resist layer that covers the first spacer; forming a patch pattern over a second spacer and aligned with the opening; etching the patterning-target layer using the patch pattern and the second spacer as mask elements to form final patterns; and removing the patch pattern and the second spacer to expose the final patterns. In some embodiments, a first final pattern is located at a distance in a range from about (n+0.3) times of a pitch to about (n+0.8) times of the pitch away from an adjacent second final pattern, where n is an integer number. The pitch is a distance between two adjacent spacers plus a width of a spacer.

The present disclosure provides yet another embodiment of a method for forming patterns in a semiconductor device. In accordance with some embodiments, the method includes providing a substrate and a patterning-target layer over the substrate; forming one or more mandrel patterns over the patterning-target layer; forming spacers adjacent to sidewalls of the mandrel patterns; forming an opening in a resist layer by removing a first mandrel pattern and a first spacer and removing a portion of the resist layer that covers the first spacer and the first spacer; forming a patch pattern over a second spacer and aligned with the opening; forming one or more patch spacers adjacent to sidewalls of the patch pattern; etching the patterning-target layer using the one or more patch spacers and the second spacer as mask elements to form final patterns; and removing the one or more patch spacers and the second spacer to expose the final patterns. In some embodiments, a first final pattern is located at a distance in a range from about (n+0.3) times of a pitch to about (n+0.8) times of the pitch away from an adjacent second final pattern, where n is an integer number. The pitch is a distance between two adjacent spacers plus a width of a spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a material layer over a semiconductor substrate;
   forming a first mandrel feature and a second mandrel feature over the material layer;
   forming spacers adjacent to sidewalls of the first mandrel feature and the second mandrel feature;
   removing the first mandrel feature and the second mandrel feature;
   forming a patch pattern over the spacers; and
   patterning the material layer using the patch pattern and the spacers as a mask to form a patterned material layer, wherein the patterned material layer includes a first feature and a second feature, wherein the first feature is located at a distance in a range from about n+0.3 times of a pitch to about n+0.8 times of the pitch away from the second feature, wherein n is an integer number, and wherein the pitch is a distance between the first and second features plus a width of the first feature.

2. The method of claim 1, wherein forming a first mandrel feature and a second mandrel feature over the material layer includes forming a third mandrel feature over the material layer, the method further comprising:
   removing the third mandrel feature prior to forming spacers adjacent to sidewalls of the first mandrel feature and the second mandrel feature.

3. The method of claim 2, further comprising forming a photosensitive layer over the first, second, and third mandrel feature, and
   wherein removing the third mandrel feature prior to forming spacers adjacent to sidewalls of the first mandrel feature and the second mandrel feature includes removing the photosensitive layer over the third mandrel feature.

4. The method of claim 3, wherein removing the photosensitive layer over the third mandrel feature includes forming a patterned photosensitive layer that covers the first and second mandrel features and has an opening exposing the material layer.

5. The method of claim 1, further comprising forming another material layer over the spacers, and
   wherein forming the patch pattern over the spacers includes forming the patch pattern over the another material layer.

6. The method of claim 5, wherein another material layer includes silicon carbide.

7. The method of claim 5, further comprising patterning the another material layer using the patch pattern as a mask prior to patterning the material layer using the patch pattern and the spacers as a mask elements to form the patterned material layer.

8. A method comprising:
   forming a material layer over a semiconductor substrate;
   forming a plurality of mandrel features over the material layer;
   forming spacers adjacent to sidewalls of the mandrel features;
   removing at least one mandrel feature from the plurality of mandrel features;
   removing at least one spacer such that a subset of the spacers remain over the material layer;
   forming a patch pattern over the subset of the spacers; and
   patterning the material layer using the patch pattern and the subset of the spacers as a mask to form a patterned material layer, wherein the patterned material layer includes a first feature and a second feature, wherein the first feature is located at a distance in a range from about n+0.3 times of a pitch to about n+0.8 times of the pitch away from the second feature, wherein n is an integer number, and wherein the pitch is a distance between the first and second features plus a width of the first feature.

9. The method of claim 8, wherein removing the at least one mandrel feature from the plurality of mandrel features includes removing all of the mandrel features.

10. The method of claim 8, wherein the material layer includes a conductive material.

11. The method of claim 8, wherein the material layer includes a dielectric material.

12. The method of claim 8, further comprising forming a photosensitive layer over the spacers such that the spacers are embedded within the photosensitive layer.

13. The method of claim 8, wherein the subset of the spacers defining an opening, the method further comprising:
   forming another material layer within the opening.

14. The method of claim 13, wherein forming the patch pattern over the subset of the spacers includes forming the patch pattern directly on another material layer disposed within the opening.

15. A method comprising:
   forming a material layer over a semiconductor substrate;
   forming a plurality of mandrel features over the material layer;
   forming spacers adjacent to sidewalls of the mandrel features;
   removing at least one mandrel feature from the plurality of mandrel features such that a subset of the plurality of mandrel features remain over the material layer and removing at least one spacer such that a subset of the spacers remain over the material layer;
   forming a patch feature over the subset of the spacers;
   forming a patch spacer adjacent a sidewall of the patch feature; and
   patterning the material layer using the subset of the spacers and the patch spacer as a mask to form a patterned material layer, wherein the patterned material layer includes a first feature and a second feature, wherein the first feature is located at a distance in a range from about n+0.3 times of a pitch to about n+0.8 times of the pitch away from the second feature, wherein n is an integer number, and wherein the pitch is a distance between the first and second features plus a width of the first feature.

16. The method of claim 15, further comprising forming a photosensitive layer over the plurality of mandrel features and the spacers, and
   wherein removing the at least one mandrel feature from the plurality of mandrel features and removing the at least one spacer such that the subset of the spacers remain over the material layer includes removing a portion of photosensitive layer to form a patterned photosensitive layer.

17. The method of claim 16, further comprising:
   removing the patterned photosensitive layer to expose the subset of the plurality of mandrel features and the subset of the spacers; and
   removing at least one mandrel feature from the subset of the plurality of mandrel features after removing the patterned photosensitive layer.

18. The method of claim 15, wherein removing the at least one mandrel feature from the plurality of mandrel features includes partially removing one of the mandrel features such that a portion of the mandrel feature remains over the material layer.

19. The method of claim 15, wherein n is equal to 1.

20. The method of claim 15, further comprising forming another material layer directly on the subset of the spacers, and
   wherein forming the patch feature over the subset of the spacers includes forming the patch feature directly on the another material layer.

* * * * *